(12) United States Patent
Tsai et al.

(10) Patent No.: US 10,636,670 B2
(45) Date of Patent: Apr. 28, 2020

(54) METHOD OF PLANARIZING SEMICONDUCTOR DEVICE

(71) Applicant: TAIWAN SEMICONDUCTOR MANUFACTURING CO., LTD., Hsinchu (TW)

(72) Inventors: Yi-Jen Tsai, New Taipei (TW); Yuan-Tai Tseng, Hsinchu County (TW); Shih-Chang Liu, Kaohsiung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/881,972

(22) Filed: Jan. 29, 2018

(65) Prior Publication Data

US 2018/0277381 A1    Sep. 27, 2018

Related U.S. Application Data

(60) Provisional application No. 62/475,336, filed on Mar. 23, 2017.

(51) Int. Cl.
*H01L 21/31* (2006.01)
*H01L 21/3105* (2006.01)
*H01L 27/108* (2006.01)
*H01L 21/027* (2006.01)
(Continued)

(52) U.S. Cl.
CPC .... *H01L 21/31055* (2013.01); *H01L 21/0276* (2013.01); *H01L 21/31116* (2013.01); *H01L 21/31133* (2013.01); *H01L 21/31138* (2013.01); *H01L 21/76819* (2013.01); *H01L 27/10808* (2013.01); *H01L 27/10814* (2013.01); *H01L 27/10847* (2013.01); *H01L 27/10894* (2013.01); *H01L 27/10897* (2013.01)

(58) Field of Classification Search
CPC .......... H01L 21/0276; H01L 21/31053; H01L 21/32115–32125; H01L 21/3212; H01L 21/76229; H01L 21/76819; H01L 21/7684; H01L 27/10894; H01L 27/10897
See application file for complete search history.

(56) References Cited

U.S. PATENT DOCUMENTS 4,642,162 A * 2/1987 Brownell .......... H01L 21/76819
                                                  204/192.15
5,212,114 A * 5/1993 Grewal ............. H01L 21/31055
                                                  257/E21.245
(Continued)

*Primary Examiner* — Eric A. Ward
(74) *Attorney, Agent, or Firm* — McClure, Qualey & Rodack, LLP

(57) ABSTRACT

A method of planarizing a semiconductor device includes forming a first region and a second region on a semiconductor substrate. The first region has a larger thickness than a thickness of the second region. An interlayer dielectric layer is conformally deposited on the first region and the second region. A photoresist is formed on the second region. A bottom anti-reflective coating layer is formed on the photoresist, first region and second region. A planarization process is performed to the semiconductor substrate. The planarization process to the first region and the second region includes removing portions of the interlayer dielectric layer, the photoresist and the BARC layer.

20 Claims, 17 Drawing Sheets

(51) Int. Cl.
*H01L 21/311* (2006.01)
*H01L 21/768* (2006.01)

(56) References Cited

U.S. PATENT DOCUMENTS

| | | | | |
|---|---|---|---|---|
| 5,710,076 A | * | 1/1998 | Dai | H01L 21/76224 |
| | | | | 257/E21.546 |
| 6,280,644 B1 | * | 8/2001 | Martin | H01L 21/31056 |
| | | | | 216/16 |
| 7,393,789 B2 | * | 7/2008 | Abatchev | H01L 21/0337 |
| | | | | 438/692 |
| 2005/0014330 A1 | * | 1/2005 | Park | H01L 21/31053 |
| | | | | 438/239 |
| 2012/0028468 A1 | * | 2/2012 | Cheng | H01L 21/31138 |
| | | | | 438/694 |

\* cited by examiner

METHOD OF PLANARIZING SEMICONDUCTOR DEVICE

CROSS-REFERENCE TO RELATED APPLICATION

This application claims priority to U.S. Provisional Application Ser. No. 62/475,336, filed Mar. 23, 2017, which is herein incorporated by reference in its entirety.

BACKGROUND

Dynamic random access memory (DRAM) devices are used extensively in the electronics industry for information storage. A high density DRAM includes millions of memory cells. Each memory cell on the DRAM chip comprises a pass transistor, e.g. a metal-oxide-semiconductor field-effect transistor (MOSFET) and a storage capacitor for storing charge. Embedded DRAM (EDRAM) is a type of integrated circuit (IC) that combines DRAM circuits and logic circuits together in a semiconductor substrate. Nowadays, the trend in manufacturing semiconductor ICs is to integrate memory cell arrays with high-speed logic circuit elements. For example, microprocessors or digital signal processors all have integrated circuits that incorporate embedded memory.

However, the prior method of fabricating EDRAM encounters a serious topographical problem of an interlayer dielectric (ILD) layer before a metallization process is carried out. More specifically, the prior method encounters a problem resulting from a large difference in height on the ILD layer between a memory region and a logic region on an EDRAM. The problem of this large step height difference becomes increasingly critical for the production yield. With large step height difference, severe defects such as routing failure occur in the subsequent metallization process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
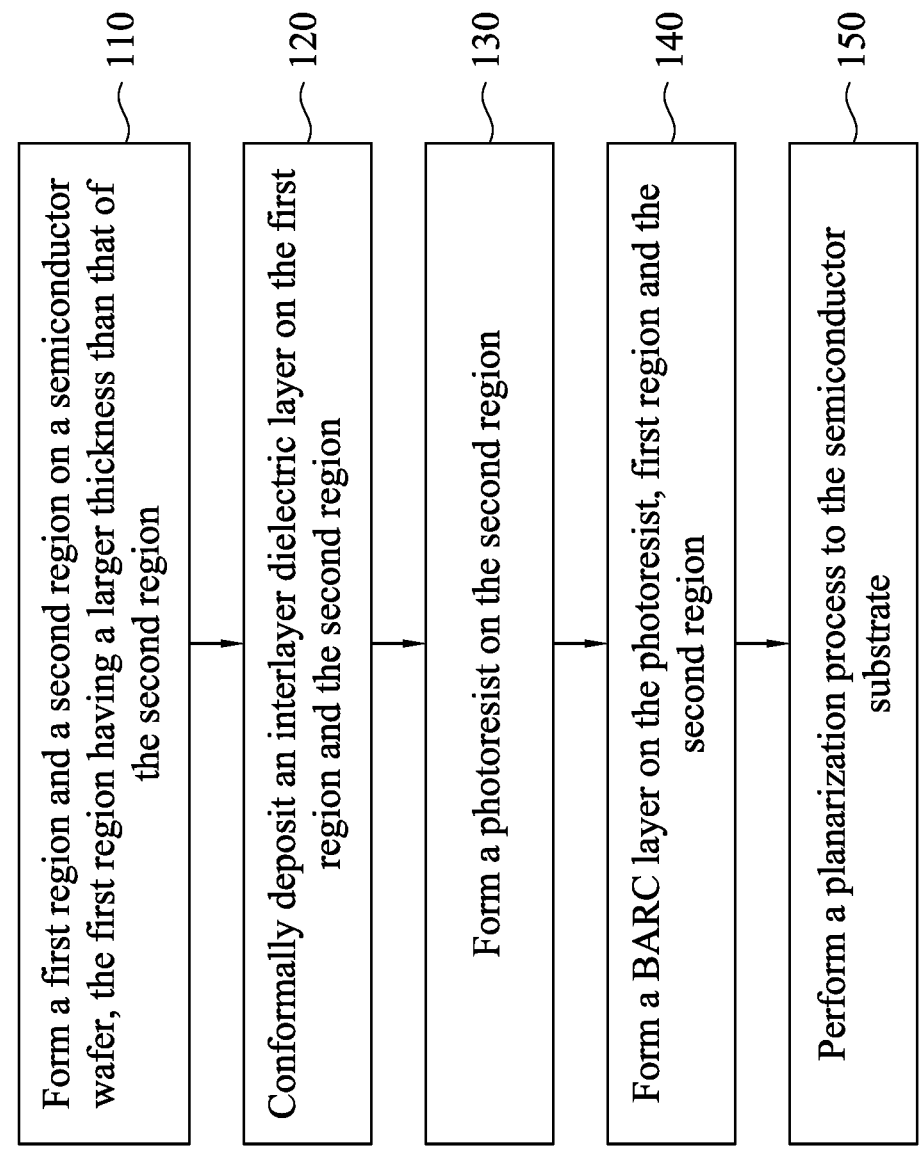
FIG. 1 is a flow chart illustrating a method of planarizing a semiconductor device in accordance with some embodiments of the instant disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A trend in semiconductor manufacturing is to integrate different devices, such as a memory cell array and a logic circuit, on a same substrate. The fabrication process of these embedded integrate circuits (ICs) may include a series of planarization processes. For example, memory gate structures of an embedded flash memory IC can be formed by depositing a self-aligned conductive layer, followed by a chemical-mechanical polishing (CMP) process that planarizes a top surface of the conductive layer to form the memory gate structures. In such manufacturing processes, the CMP process may not result in a planar surface as expected. This is because the CMP process removes different materials at different rates, resulting in surface anomalies. For example, memory cell region will have a thicker conductive layer than logic region.

The non-uniformity of the conductive layer (i.e., the reduced thickness of the conductive layer at the logic region relative to the memory cell region) results in surface damage to the substrate at the logic region during the subsequent processes. The unwanted "step" between the memory cell region and the logic region may also introduce contaminants that harm performance of the IC. Furthermore, in current manufacturing processes, residues may be left at corners of steps, which may result shorting problems, performance degradation, and even device failure.

Referring to FIG. 1, a flow chart of a method 100 of fabricating a semiconductor device in accordance with some embodiments of the instant disclosure. The method begins with operation 110 in which a first region and a second region are formed on a semiconductor wafer. The first region has a larger thickness than that of the second region. The method continues with operation 120 in which an interlayer dielectric layer is conformally deposited on the first region and the second region. Subsequently, operation 130 is performed. A photoresist is formed on the second region. The method continues with operation 140 in which a first mask layer is formed on the photoresist, first region and the second region. The method continues with operation 150 in which a planarization process is performed to the semiconductor substrate.

Figure 2:
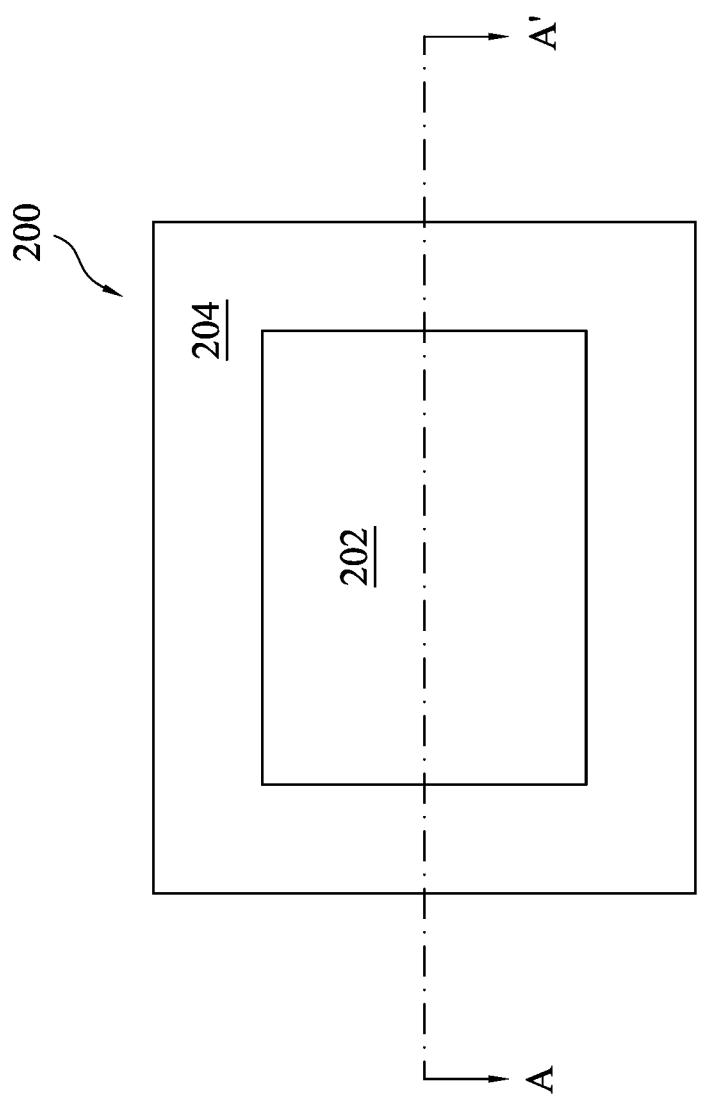
FIG. 2 is a plan view of a portion of a semiconductor device in accordance with some embodiments of the instant disclosure.

Reference is made to FIG. 2. FIG. 2 shows a plan view of an integrated circuit (IC) 200 having a first region 202 and a second region 204. In some embodiments, the first region 202 is a memory cell region, and the second region 204 is a logic region.

Figure 3:
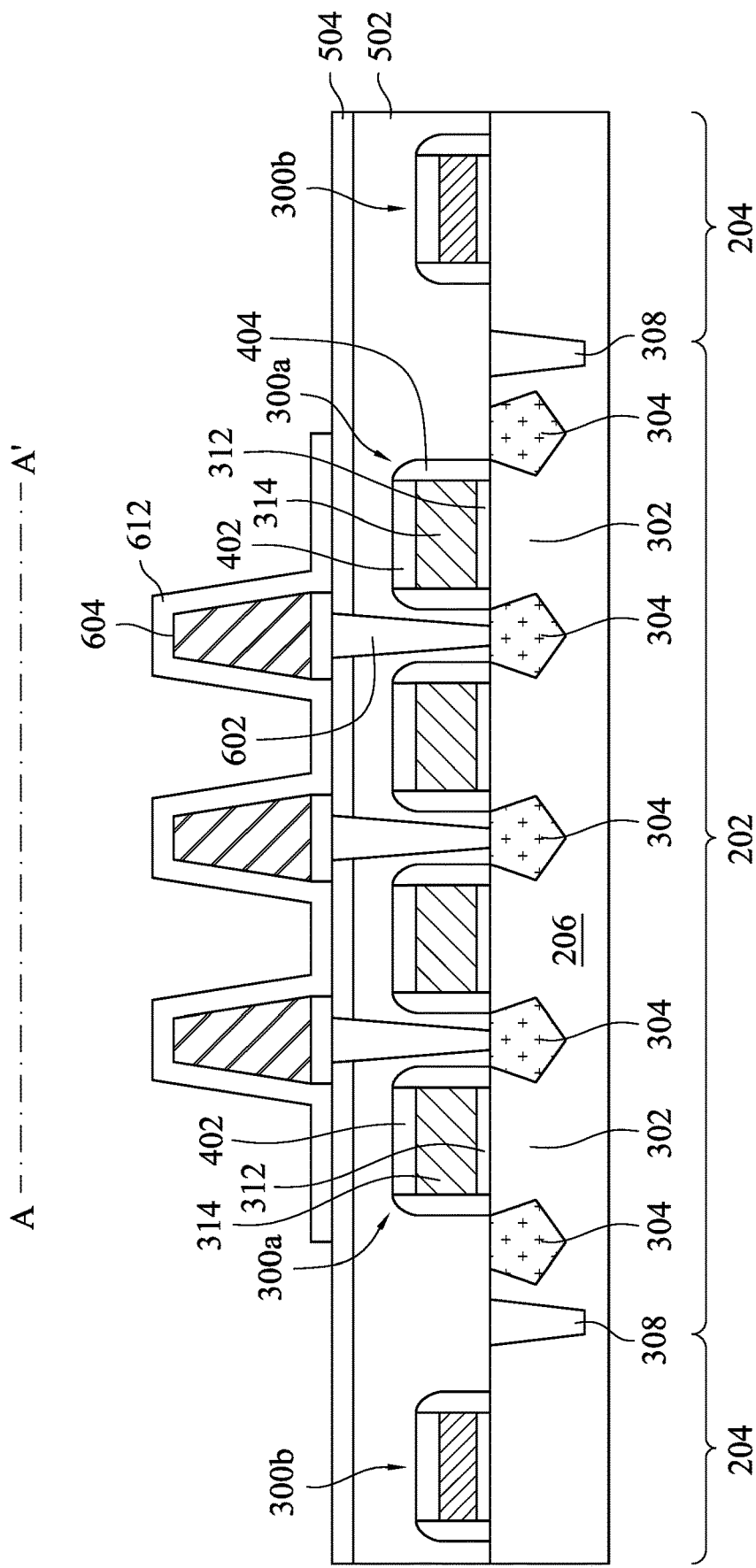
FIGS. 3-10 are cross-sectional views along A-A' of a portion of the semiconductor device in FIG. 2 at various stages in a planarization process in accordance with some embodiments of the instant disclosure.

Reference is made to FIG. 3 and operation 110 in FIG. 1. FIG. 3 shows some embodiments of a cross-sectional view of the integrated circuit 200 of FIG. 2 taken along cross-sectional line A-A'.

The first region 202 includes a plurality of gate structures 300a disposed on the semiconductor substrate 206. The semiconductor substrate 206 may include such as a silicon wafer. The semiconductor substrate 206 may alternatively be made of other suitable semiconductor material, including Ge, SiGe, or GaAs. Each of the gate structures 300a has source/drain regions 304 formed in the semiconductor substrate 206. The source/drain regions 304 are spaced apart by a channel region 302. A gate dielectric layer 312 is disposed between the gate electrode 314 and the channel region 302. In some embodiments, the gate structures 300a are memory cells. The gate electrode 314 may include a floating gate and a control gate. The control gate is capacitively coupled to the floating gate, which may be separated by a charge trapping dielectric layer. In some embodiments, a hard mask layer 402 is disposed over the gate electrode 314. A pair of spacers 404 is disposed along sidewalls of gate electrode 314.

Reference is still made to FIG. 3. A plurality of isolation structures 308 such as shallow trench isolations (STIs) is disposed within the semiconductor substrate 206 along the boundary of the memory cell region 202. The isolation structures 308 stand between the first region 202 and the second region 204. In some embodiments, the isolation structures 308 separate the memory cell region from the logic region on the semiconductor substrate 206 such that the first region 202 and the second region 204 are spaced apart from each other. A plurality of gate structures 300b is formed on the semiconductor substrate 206 over the second region 204. In some embodiments, the gate structures 300b may be one or more logic transistor devices. Each of the gate structures 300b includes a gate dielectric interposed in between the gate electrode and the semiconductor substrate 206. A hard mask layer may be formed on the gate electrode, and a pair of spacers is formed around sidewalls of the gate electrode.

Reference is still made to FIG. 3. A first interlayer dielectric layer 502 is disposed on the gate structures 300a and 300b. The first interlayer dielectric layer 502 blankets the surface of the semiconductor substrate 206 and buries the gate structures 300a and 300b. The top surface of the first interlayer dielectric layer 502 is substantially planar. As shown in FIG. 3, an oxide layer 504 may be formed on the first interlayer dielectric layer 502.

As shown in FIG. 3, in some embodiments, the first region 202 includes a plurality of capacitor structures 604 disposed on the oxide layer 504. The capacitor structures 604 are electrically connected to the underlying source/drain regions 304 through plugs 602. The plugs 602 go through the oxide layer 504 and the first interlayer dielectric layer 502 and make contact with the source/drain regions 304 in the semiconductor substrate 206. A buffer layer 612 is conformally formed on the capacitor structures 604, reproducing the waved topology of the capacitor structures 604 on the oxide layer 504.

Figure 4:
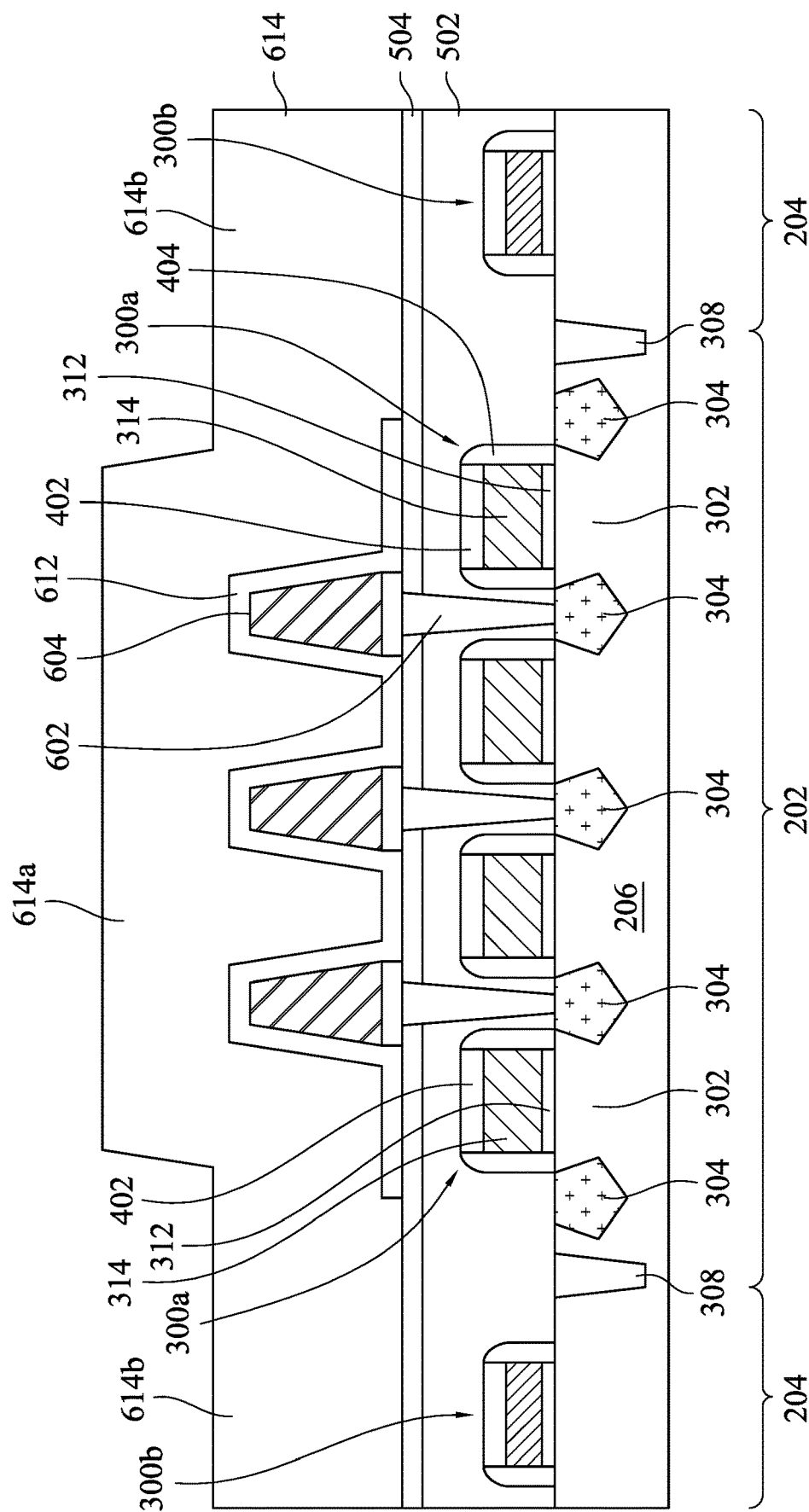

Reference is made to FIG. 4 and operation 120 in FIG. 1. A second interlayer dielectric layer 614 is conformally deposited on the semiconductor substrate 206. The first region 202 and the second region 204 have different components disposed thereon. The first region 202 includes capacitor structures 604 disposed on the first interlayer dielectric layer 502 (oxide layer 504), while at the same level the second region 204 does not have the capacitor structures 604. A pronouncedly uneven topology is therefore created. The cluster of components (e.g., capacitor structures 604) on the first region 202 is translated to a peak 614a on the second interlayer dielectric layer 614, and the peak gradually declines to plateau 614b at the second region 204. The second interlayer dielectric layer 614 therefore inherits the uneven topology created by the first region 202 (capacitor structures 604) and the second region 204. This uneven topology may be referred to as mesa-like surface.

Figure 5:
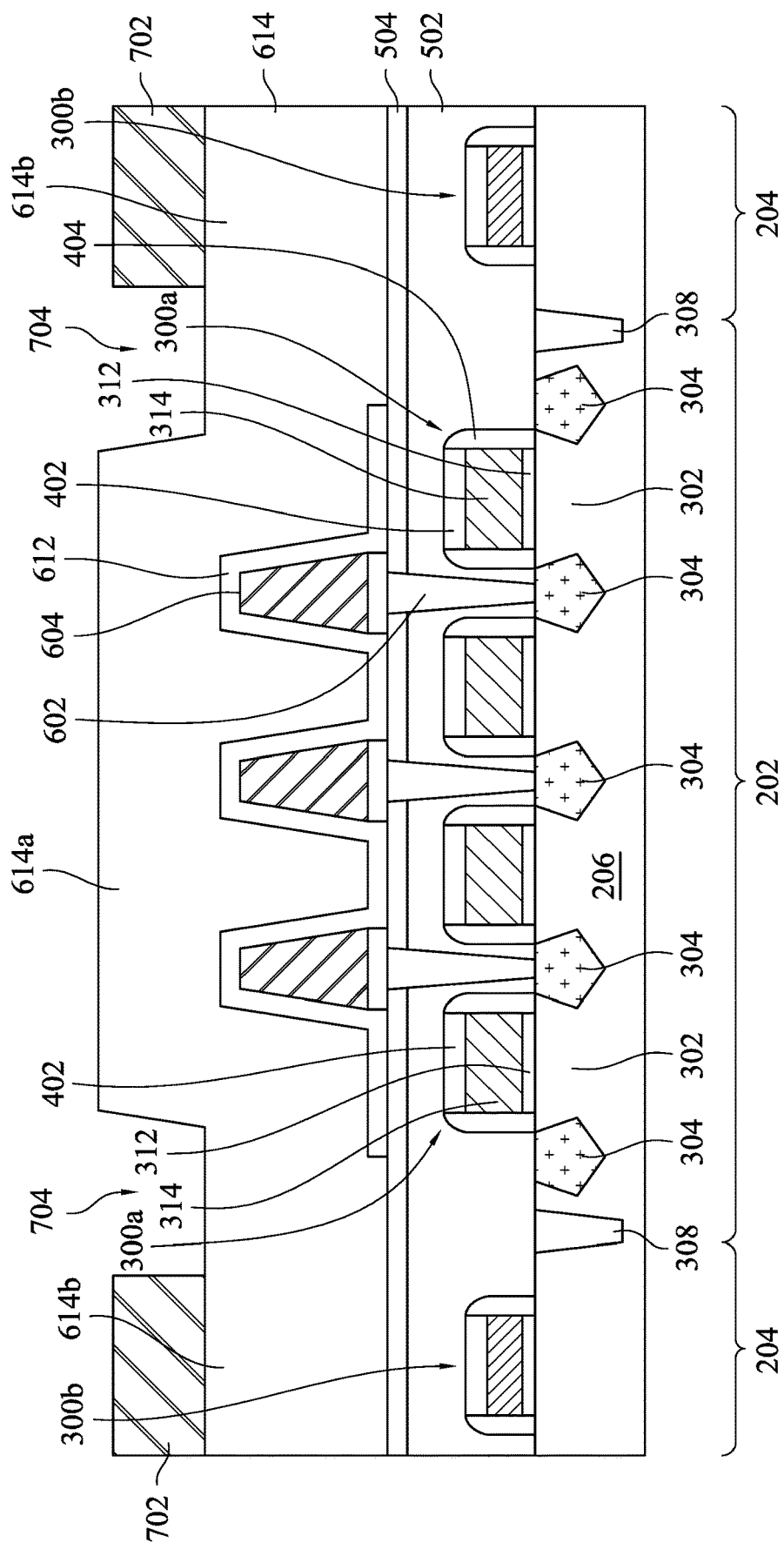

Reference is made to FIG. 5 and operation 130 in FIG. 1. Photoresists 702 are formed on the second interlayer dielectric layer 614. A photoresist layer is disposed on the second interlayer dielectric layer 614 and then patterned to form the photoresists 702 on the second region 204 but not the first region 202. The gate structures 300b and its overlying first interlayer dielectric layer 502 and the plateau 614b of the second interlayer dielectric layer 614 are under the protection range of the patterned photoresists 702. The gate structures 300a and its overlying first dielectric layer 502, capacitor structures 604, and peak 614a of the second interlayer dielectric layers 614 are not under the protection range of the photoresists 702. The photoresists 702 are spaced apart from the peak 614a (i.e., the first region 202). Recesses 704 are therefore formed between the photoresists 702 and the peak 614a. The top surface of the photoresists 702 may be substantially level with the peak 614a. That is, the thickness of the photoresists 702 is substantially the same as the peak 614a when measured from the plateau 614b.

Figure 6:
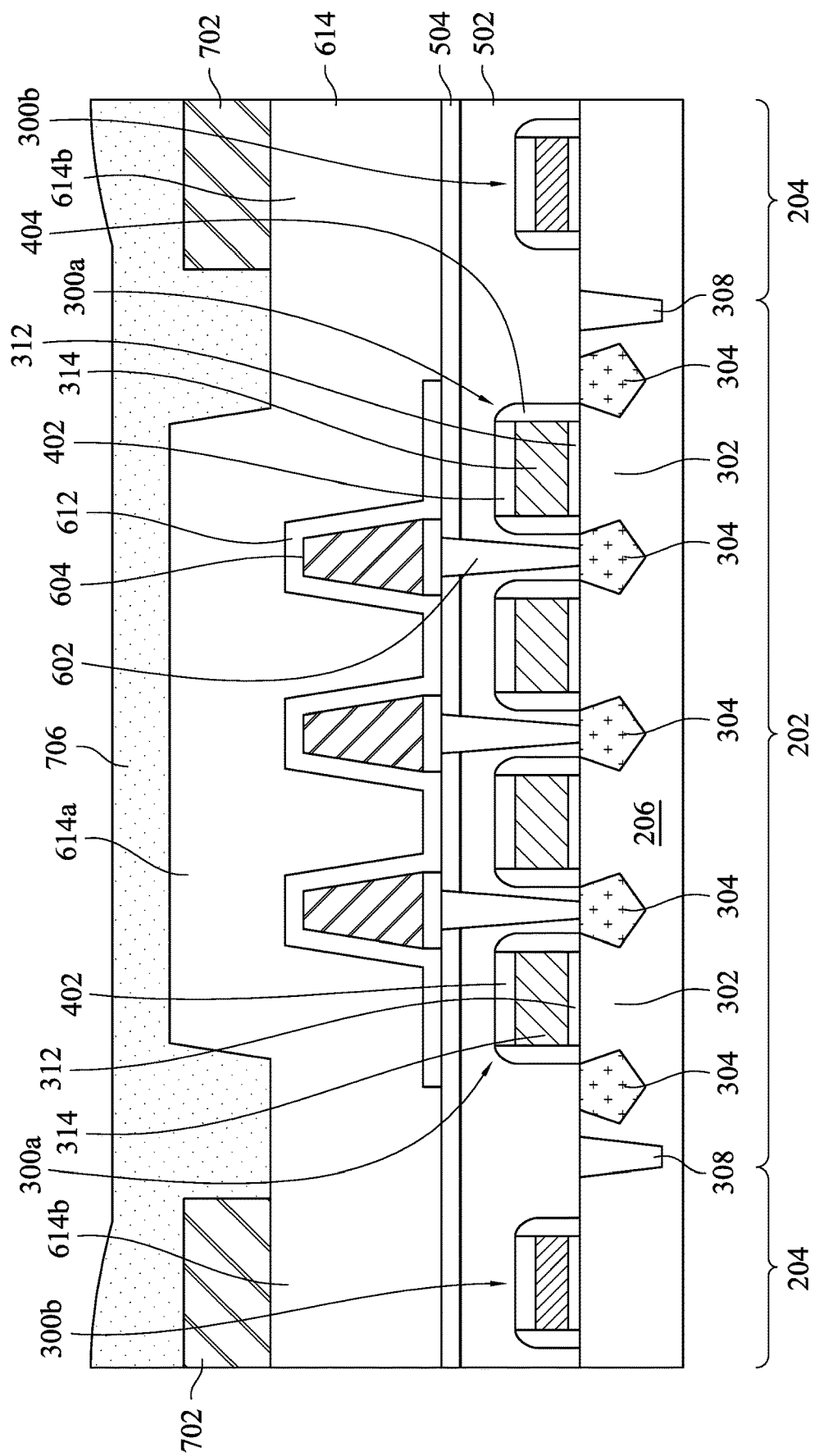

Reference is made to FIG. 6 and operation 140 in FIG. 1. A bottom anti-reflective (BARC) layer 706 is disposed on the semiconductor substrate 206. In some embodiments, process of forming the BARC layer on the semiconductor substrate 206 includes preparing a first vessel containing a BARC coating component and a second vessel containing a solvent. The BARC coating component is supplied from the first vessel and the solvent from the second vessel to a mixing chamber. The BARC coating component and the solvent are thoroughly mixed in the mixing chamber to form a product. This product is transferred and applied to the semiconductor substrate 206 to form the BARC layer 706. In some embodiments, the BARC layer 706 is formed by spin coating the BARC coating component semiconductor substrate 206. In some embodiments, heat is applied and a polymer resin stabilizes the BARC layer 706 by cross-linking.

The BARC layer 706 defines a new topology over the semiconductor substrate 206. The BARC layer 706 has relatively low viscosity in comparison with the second interlayer dielectric layer 614. In other words, the BARC layer 706 has higher fluidity than the second inter layer dielectric layer 614. The BARC layer 706 contains diluting solvents, e.g. ethyl lactate, and crosslinker components, and a polymer component, such as polyvinyl phenol. The solvents and the BARC coating components are mixed at an appropriate ratio, and this ratio is a function of the desired viscosity. The viscosity of the BARC layer 706 can be changed by changing the procedure in which the material formulation is completed and the sequencing of time and temperature. A desired viscosity ranges between 0 and 5000 may be used.

The ability of reflowing allows the BARC layer 706 fills in the recesses 704 between the photoresists 702 and the peak 614a. The BARC layer 706 blankets the entire surface of the semiconductor substrate 206 such that the photoresists 702 and the second interlayer dielectric layer 614 are buried under the BARC layer 706. Due to the reflowing tendency (low viscosity) of the BARC layer 706, recesses 704 are filled, and a flat surface is generated. The topology originally created by the peak 614a and plateau 614b are now concealed by the BARC layer 706. A mild bulge of the BARC layer 706 may occur in which the photoresists 702 stand.

Figure 7:
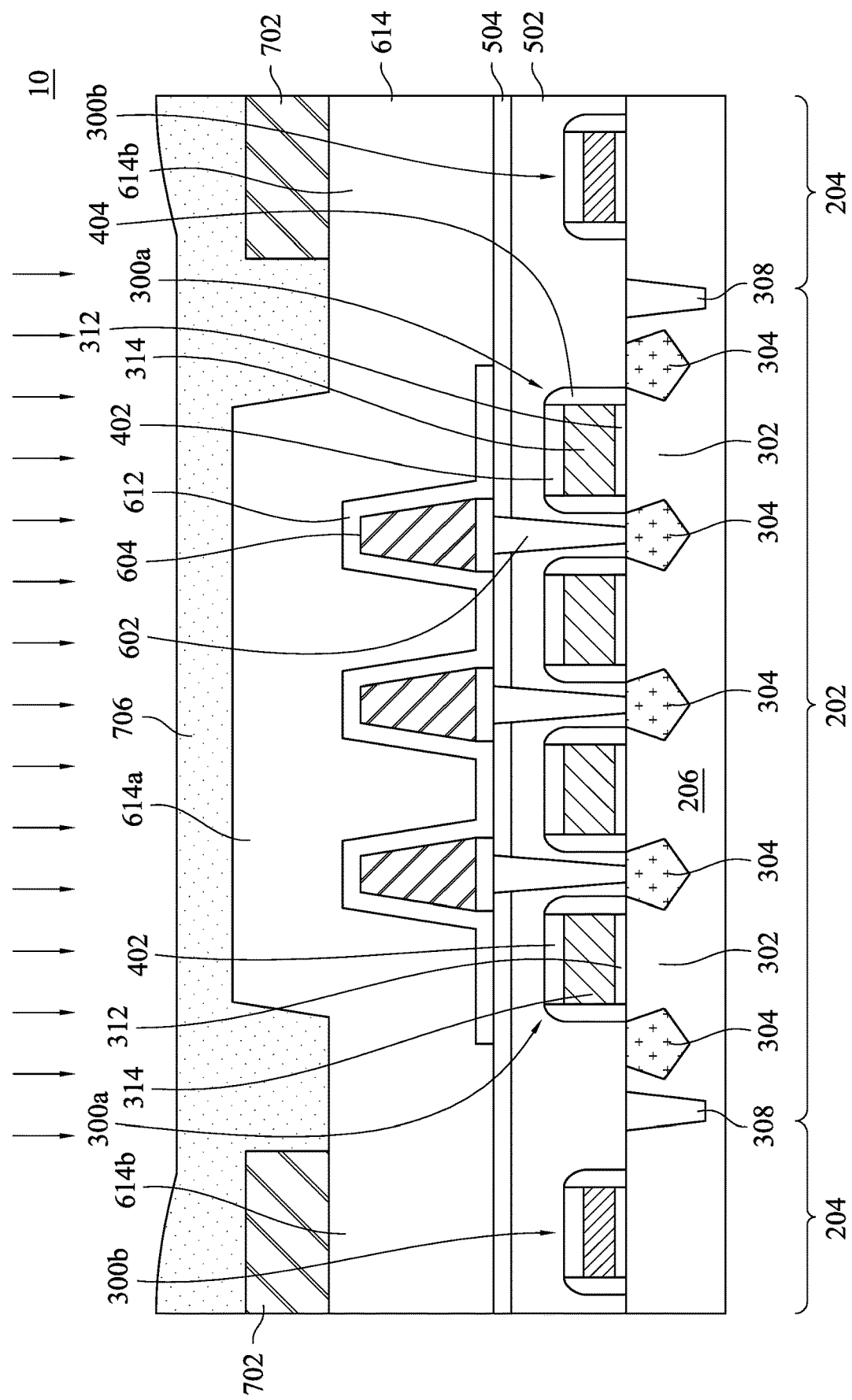

Reference is made to FIG. 7 in conjunction with 8 and operation 150 in FIG. 1. As shown in FIG. 7, a planarization process 10 is performed to the semiconductor substrate 206. Portions of the second interlayer dielectric layer 614, photoresists 702 and BARC layer 706 are removed. In some embodiments, the photoresists 702 and the BARC layer 706 are removed by an etching process, for example, a dry etching process using plasma. Plasma etching may use source gases that include $H_2$ and $N_2$. In some embodiments, the plasma etching is the absence of fluorine compounds from the source gases. In some embodiments, the etching process uses a gas flow rate in the range from 5 to 1000 ml/min. In some embodiments, the etching process is carried out at a pressure ranging from 1 to 100 mTorr. In some embodiments, the etching process uses a plasma source at a power setting ranging from 200 to 5000 W. In some embodiments, the etching process uses bias power up to 500 W. In some embodiments, the etching process is carried out at a temperature ranging from 10 to 60° C. The BARC layer 706 and the second interlayer dielectric layer 614 show an etching selectivity of approximately 1 or slightly smaller than 1. That is, a ratio of an etching rate between the BARC layer 706 and the second interlayer dielectric layer 614 ranges from 1:1 to 0.9:1. The BARC layer 706 and the second interlayer dielectric layer 614 have substantially the same etching resistance to the dry etching such that a planarization process treats the semiconductor substrate 206 as one single type of target.

Figure 8:
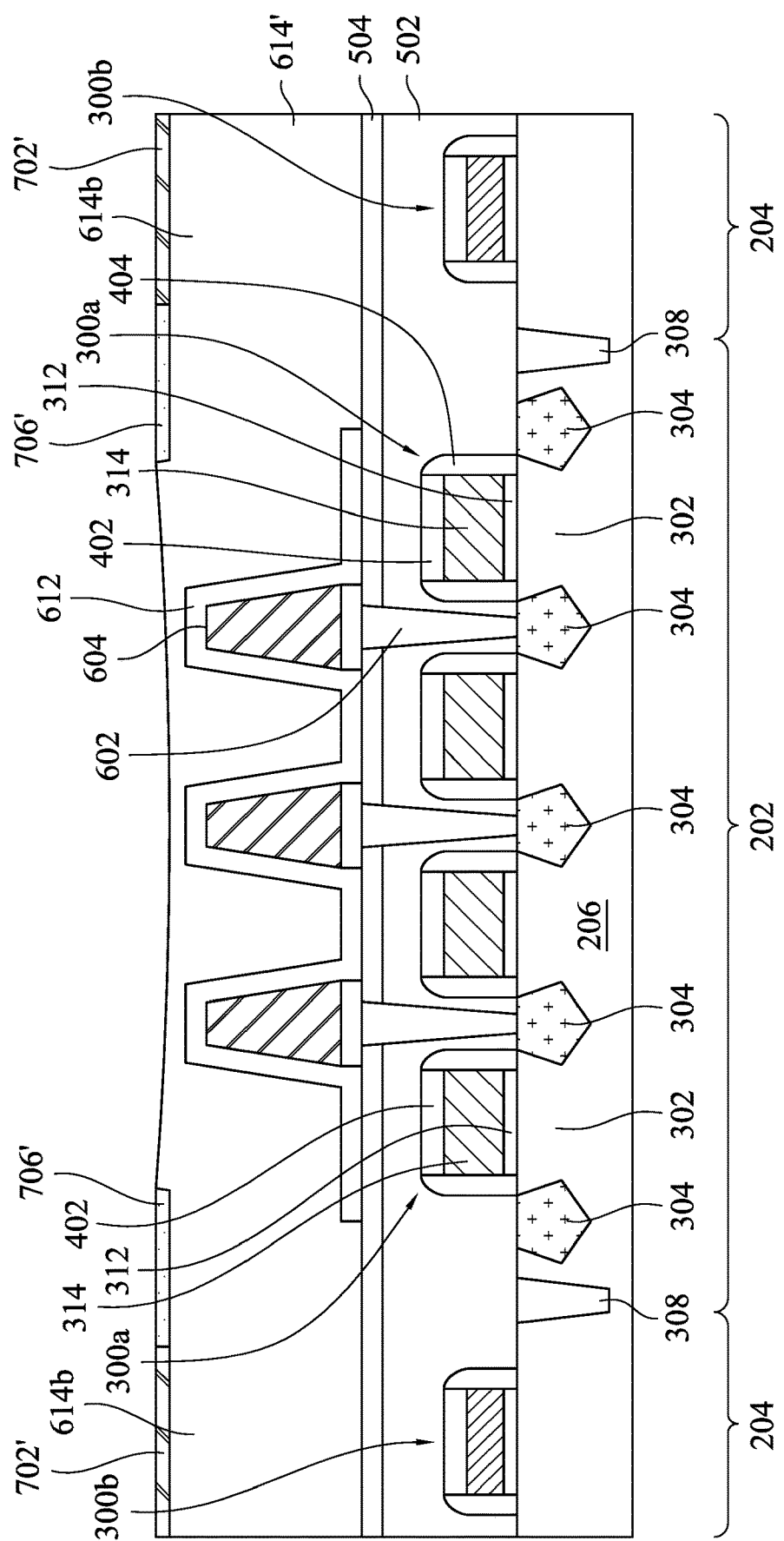

Reference is made to FIG. 8. After the planarization process 10 the peak 614a of the second interlayer dielectric layer 614 is greatly attenuated. The height of the peak 614a is reduced to a similar level as the plateau 614b. Still, residues of the BARC layer 706' and the photoresists 702' remain on the semiconductor substrate 206. The BARC layer 706 and the photoresists 702 protect the underlying plateau 614b from attack during the planarization. Because the BARC layer 706 and the second interlayer dielectric layer 614 have similar etching rate, the planarization process 10 brings the semiconductor substrate 206 with a relatively planar top surface. The step height between the first region 202 and the second region 204 is negotiated to a neglectable degree. Even though the first region 202 includes capacitor structures 604 that is absent in the second region 204, the second interlayer dielectric layer 614' does not show dramatic peaks and grooves or sub-trenches after planarization.

Figure 9:
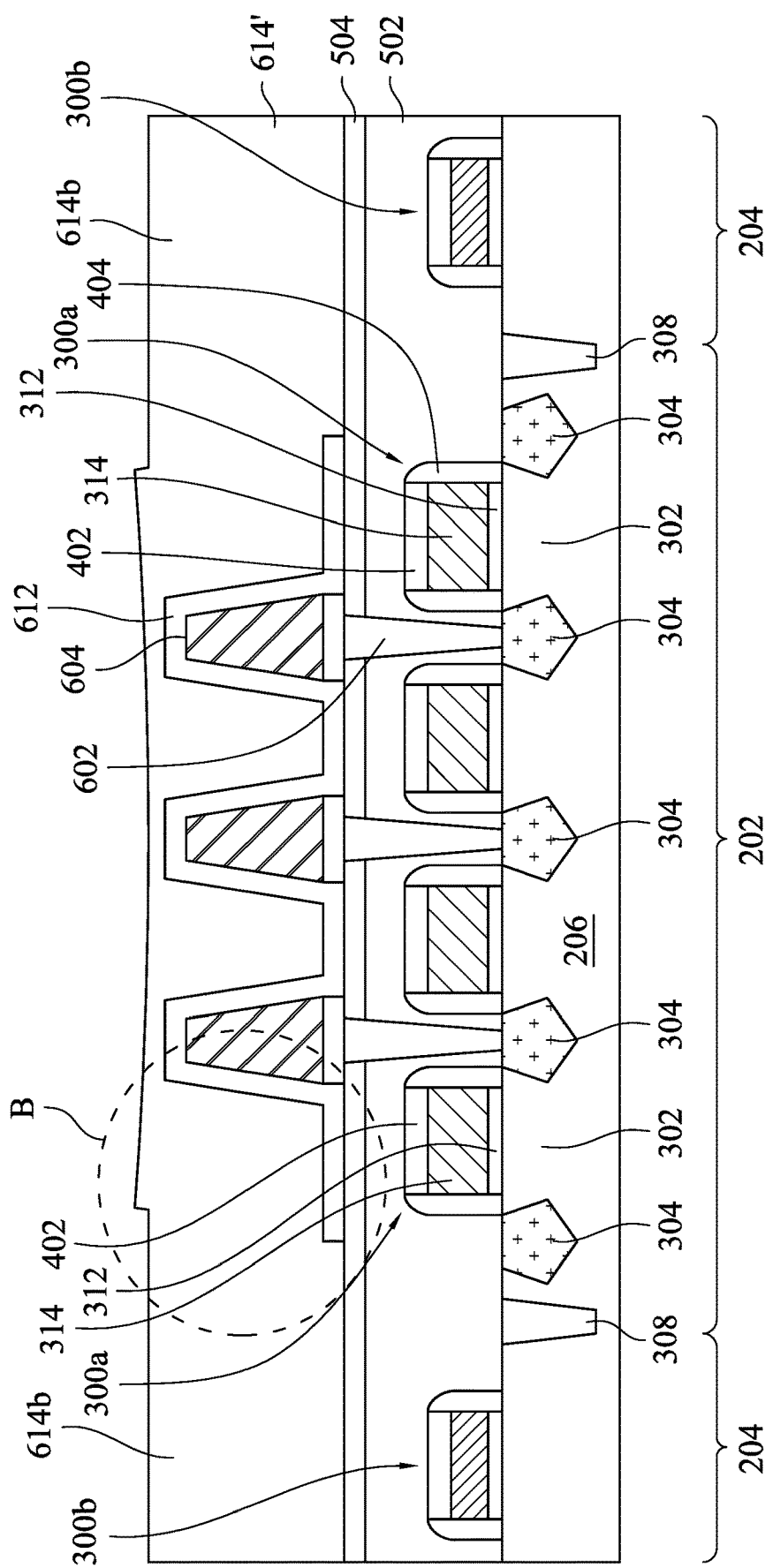

Reference is made to FIG. 9. The remaining photoresists 702' and BARC layer 706' are removed from the surface of the second interlayer dielectric layer 614'. The residues of the photoresists 702' and BARC layer 706' may be removed by for example, ashing in an oxygen ($O_2$) plasma and wet-etch solution including $H_2SO_4/H_2O_2$. The addition of the photoresists 702 and BARC layer 706 on the semiconductor substrate 206 before planarization ensures a uniform thickness of the second interlayer dielectric layer 614' across the first region 202 and the second region 204. In the presence of the photoresists 702 and BARC layer 706, the second dielectric layer 614 is evenly removed even though the peak 614a protruded over the plateau 614b.

Figure 10:
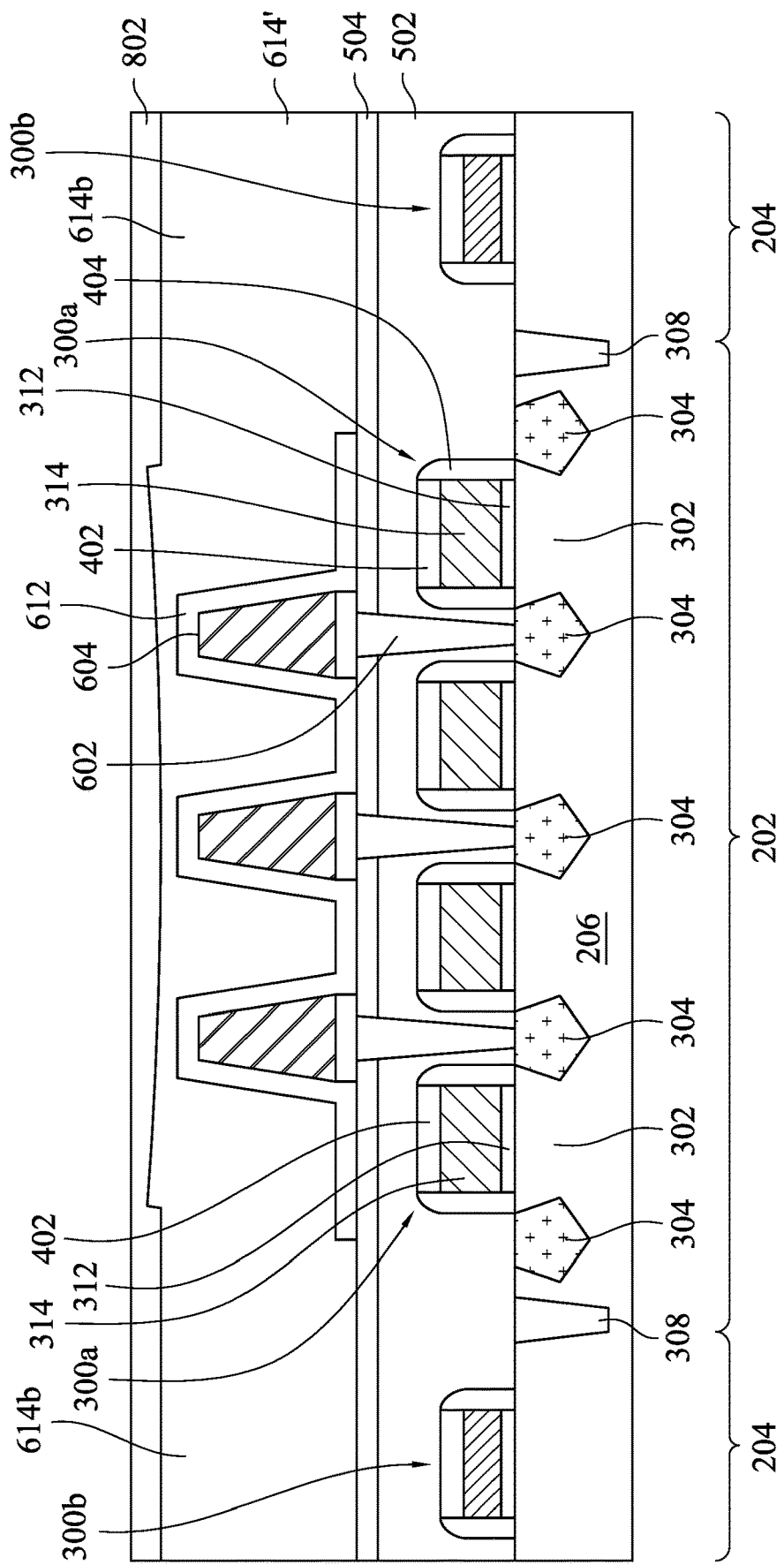
Figure 11:
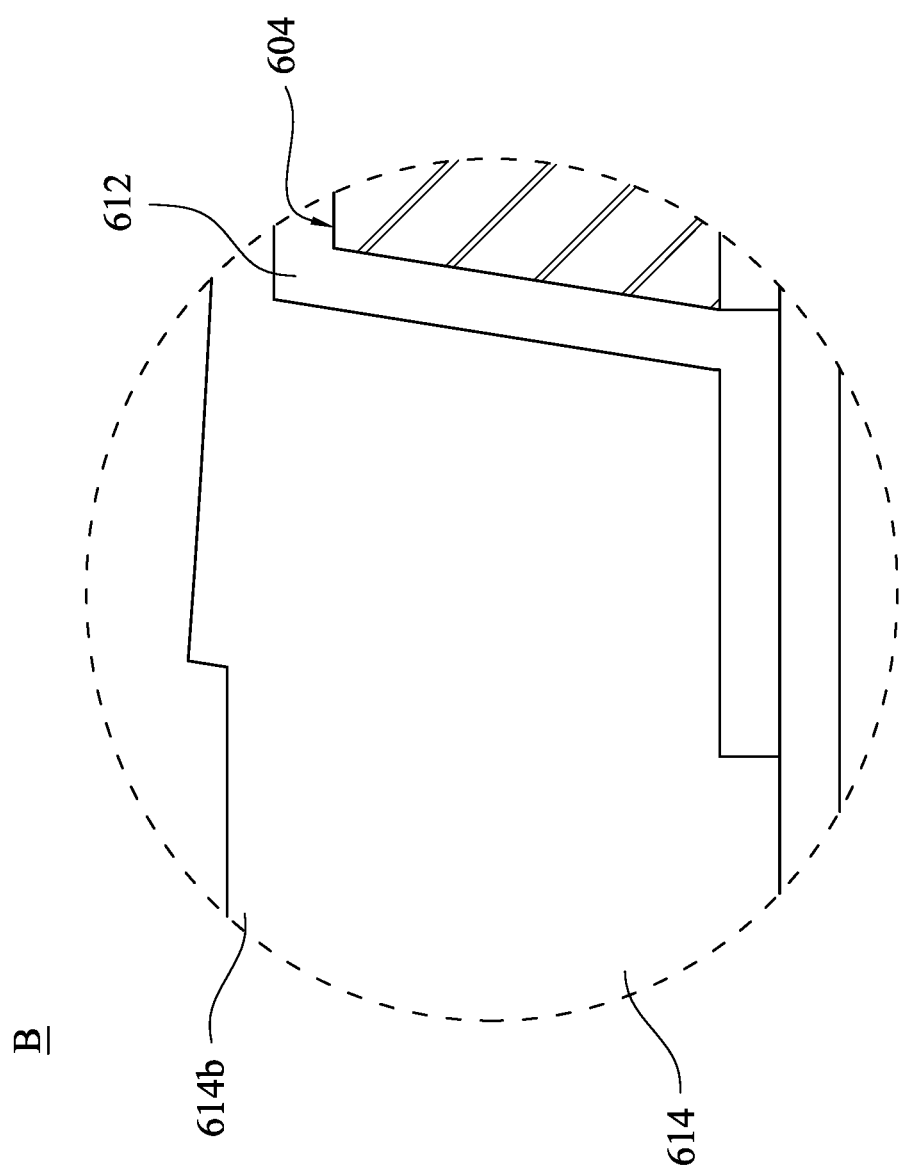
FIG. 11 is an enlarged view of area A in FIG. 9.

Reference is made to FIG. 11. A close-up view of area B in FIG. 9 is shown in FIG. 10. After planarization the second interlayer dielectric layer 614' shows relatively minor bulge on the surface. The height difference between the peak region 614a and the plateau 614b does not result in the conventional fence or trench after planarization because the photoresists 702 and BARC layer 706 protect the underlying plateau 614b. The step height between the peak 614a and the plateau 614b is eliminated during planarization. At the same time, the peak 614a (protruded portion of the second interlayer dielectric layer 614) is removed. An even height across the first region 202 and the second region 204 is ensured.

Reference is made to FIG. 10. A metal layer 802 is disposed on the surface of the second dielectric layer 614'. The surface of the second interlayer dielectric layer 614' is substantially planar with minor height difference less than 50 nm. The metal layer 802 will suffer much less from electrical short or disconnection because the surface of the second interlayer dielectric layer 614' is planar across the first region 202 and the second region 204.

Figure 12:
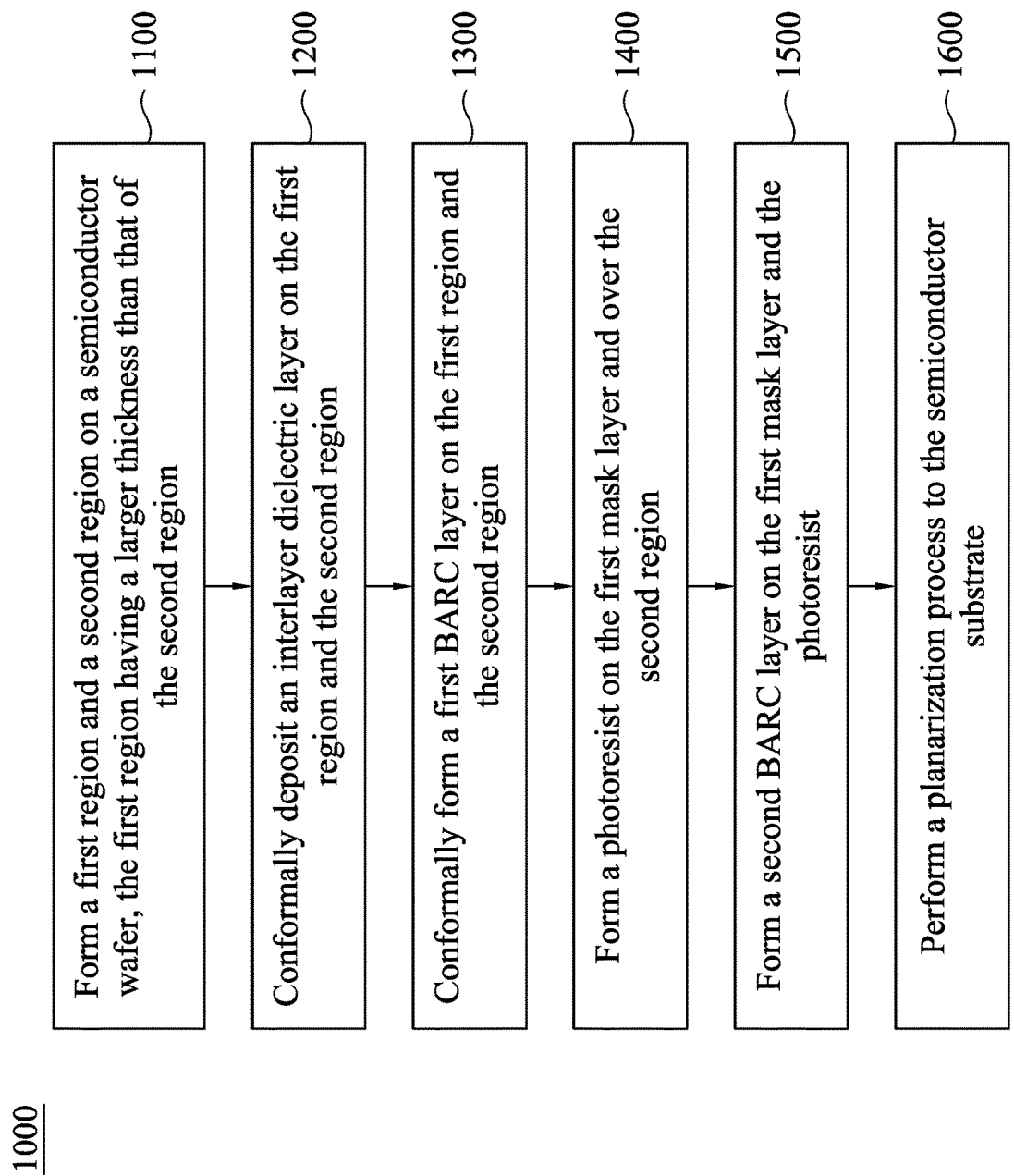
FIG. 12 is a flow chart illustrating a method of planarizing a semiconductor device in accordance with some embodiments of the instant disclosure.

Referring to FIG. 12, a flow chart of a method 1000 of fabricating a semiconductor device in accordance with some embodiments of the instant disclosure. The method begins with operation 1100 in which a first region and a second region are formed on a semiconductor wafer. The first region has a larger thickness than that of the second region. The method continues with operation 1200 in which an interlayer dielectric layer is conformally deposited on the first region and the second region. Subsequently, operation 1300 is performed. A first BARC layer is conformally formed on the first region and second region. The method continues with operation 1400 in which a photoresist is formed on the first BARC layer over the second region. The method continues with operation 1500 in which a second BARC layer is formed on the first BARC layer and the photoresist. Next, operation 160 is performed. A planarization process is performed to the semiconductor substrate.

The method 1000 is similar to the method 100 as previously discussed. The difference between the method 1000 and method 100 arises from the use of the photoresists and BARC layer. Similar process for example operation 1100 and 1200 in which elements are formed on the semiconductor substrate 206 and the first interlayer dielectric layer 614 is formed is not repeated herein to avoid redundancy. Elements with the same numeral are similar to each other.

Figure 13:
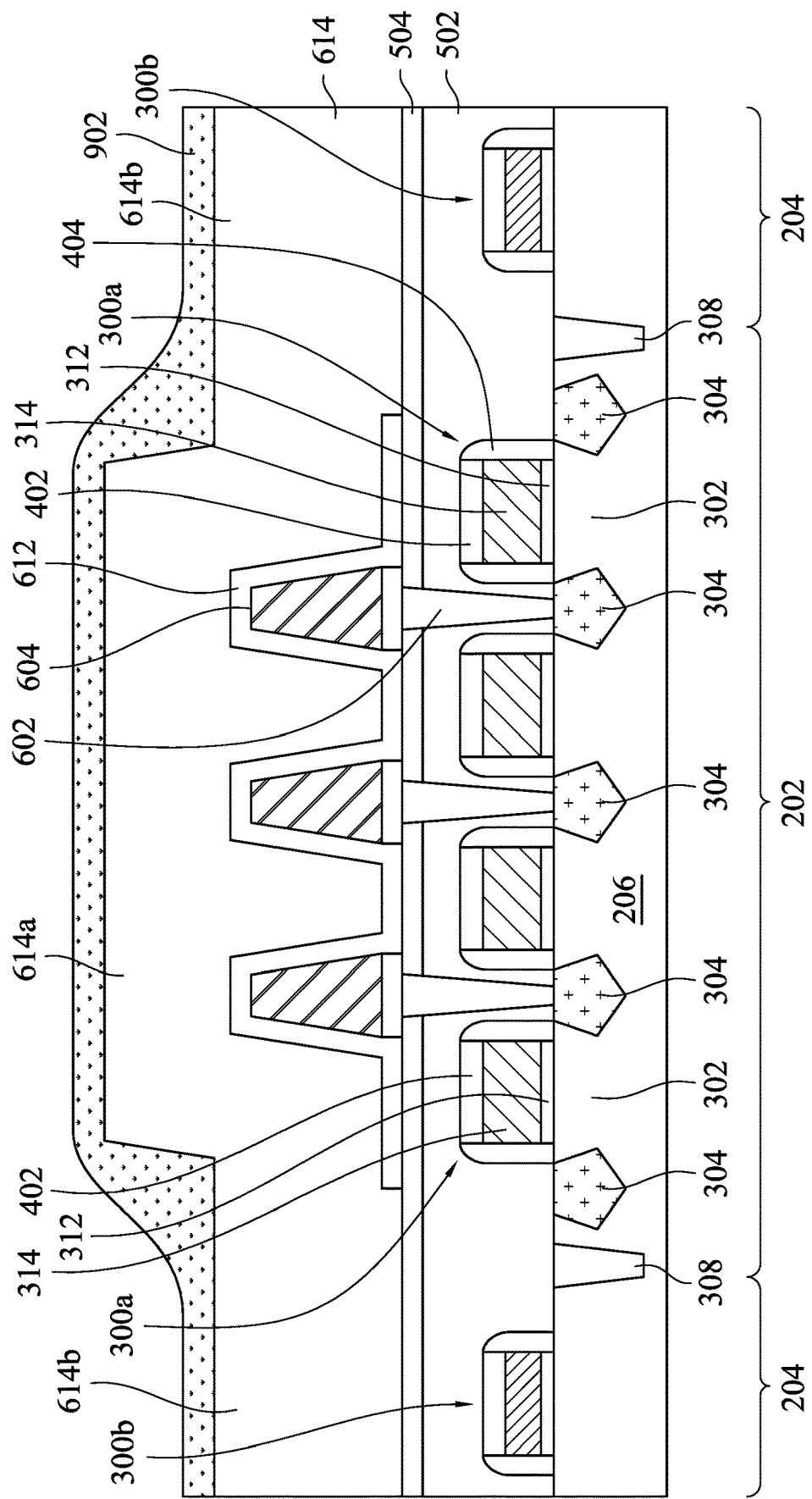
FIGS. 13-17 are cross-sectional views of a portion of a semiconductor device at various stages in a planarization process in accordance with some embodiments of the instant disclosure.

Reference is made to FIG. 13 and operation 1300 in FIG. 12. A first BARC layer 902 is conformally formed on the second interlayer dielectric layer 614. The peak 614a and plateau 614b are mildly translated to the first BARC layer 902. The first mask layer 902 exhibits smaller viscosity in comparison with the second interlayer dielectric layer 614. The first BARC layer 902 blankets the entire surface of the semiconductor substrate 206 such that the second interlayer dielectric layer 614 is buried under the first BARC layer 902. In some embodiments, the first BARC layer 902 is formed by spin coating the semiconductor substrate 206 with a solution containing monomers and initiating polymerization.

Figure 14:
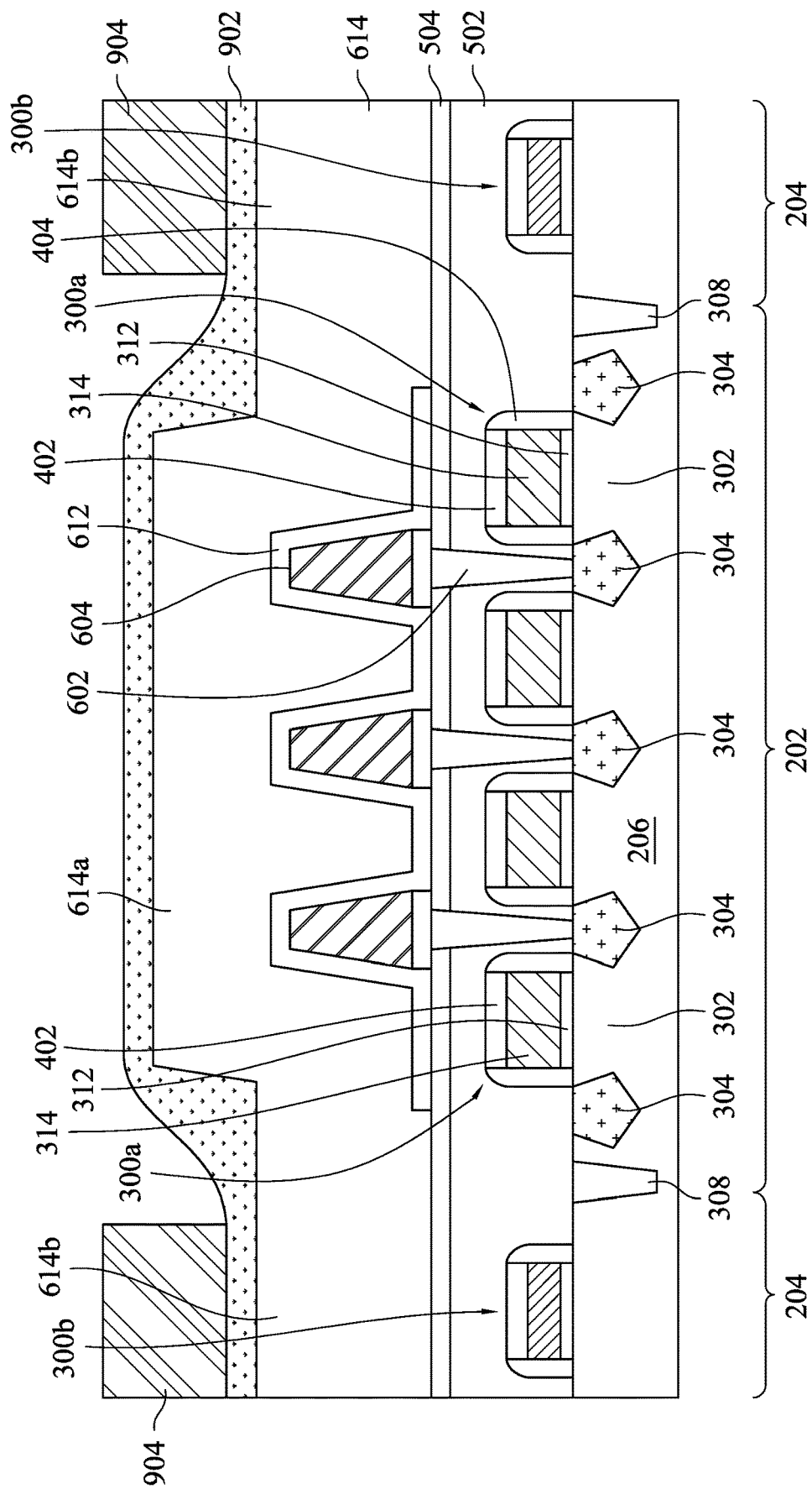

Reference is made to FIG. 14 and operation 1400 in FIG. 12. Photoresists 904 are formed on the first BARC layer 902 over the second region 204. A photoresist layer is disposed on the first BARC layer 902 and then patterned to form the photoresists 904 on the second region 204 but not the first region 202. The gate structures 300b and its overlying first interlayer dielectric layer 502 and the plateau 614b of the second interlayer dielectric layer 614 are under the protection range of the patterned photoresists 904. The gate structures 300a and its overlying first dielectric layer 502, capacitor structures 604, and peak 614a of the second interlayer dielectric layers 614 are not under the protection range of the photoresists 904. The photoresists 904 are spaced apart from the peak 614a (i.e., the first region 202). Recesses 704 are therefore formed between the photoresists 904 and the peak 614a. The top surface of the photoresists 904 may be slightly higher than the peak 614a.

Figure 15:
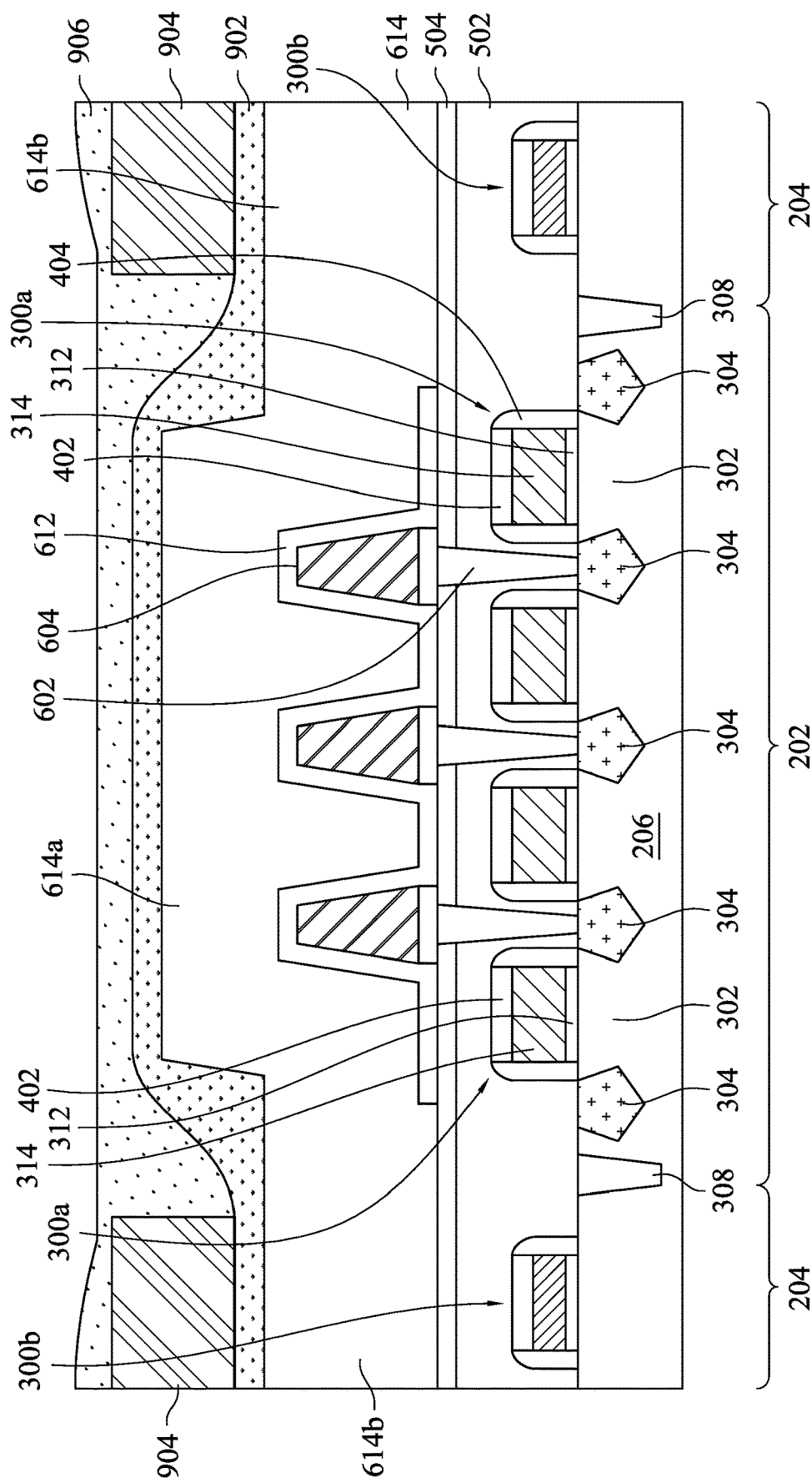

Reference is made to FIG. 15 and operation 1500 in FIG. 12. A second BARC layer 906 is disposed on the semiconductor substrate 206. The second BARC layer 906 exhibits smaller viscosity in comparison with the second interlayer dielectric layer 614. The ability of reflowing allows the second BARC layer 906 fills in the recesses 704 between the photoresists 904 and the peak 614a. The second BARC layer 906 blankets the entire surface of the semiconductor substrate 206 such that the photoresists 904 and the first BARC layer 902 are buried under the second BARC layer 906. Due to the high fluidity of the second BARC layer 906, a relatively flat surface is generated. The topology originally created by the peak 614a and plateau 614b are now concealed by the second BARC layer 906. A mild bulge of the second BARC layer 906 may occur in which the photoresists 904 stand. The second BARC layer 906 may be formed by similar process as the first BARC layer 902.

Figure 16:
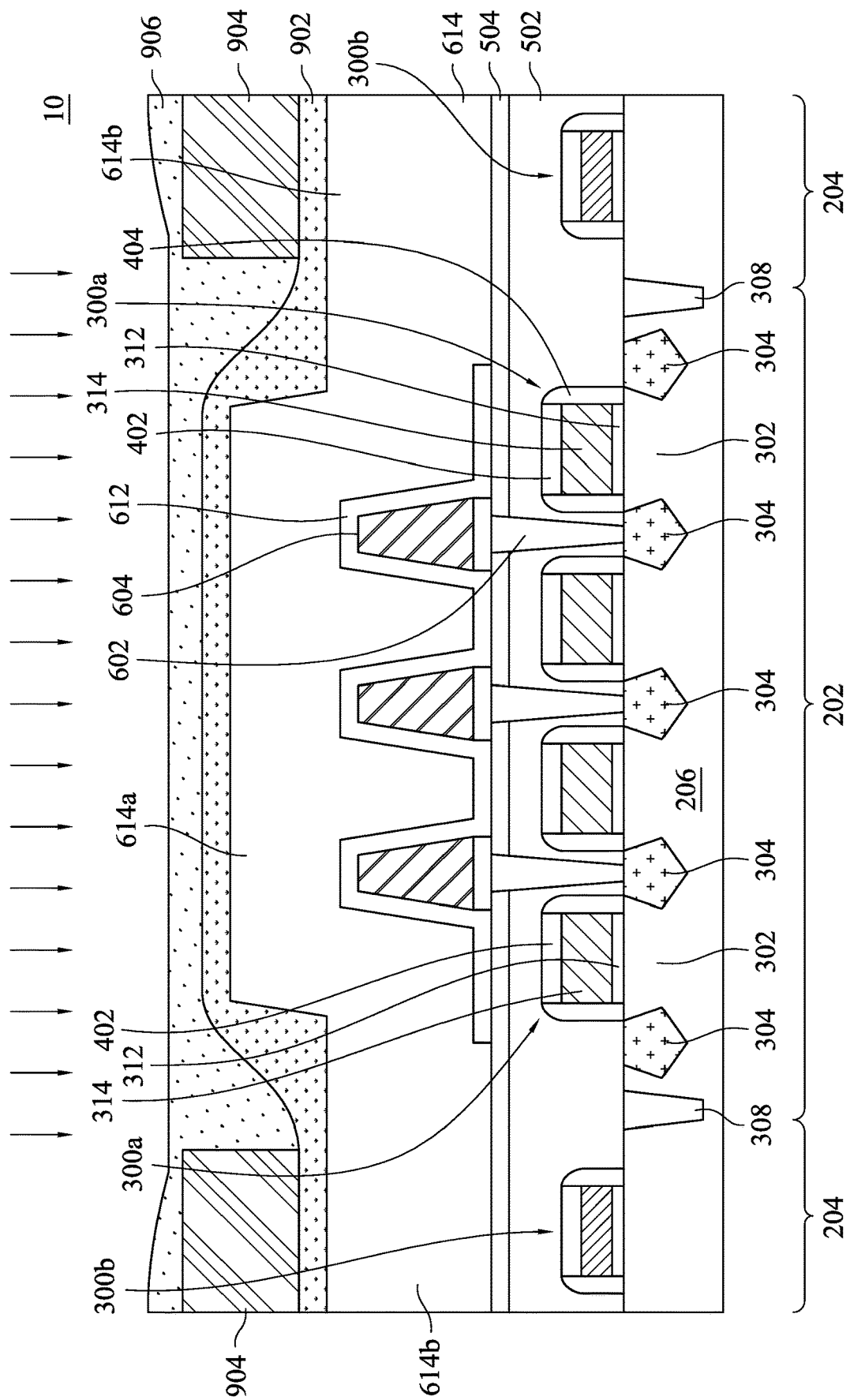

Reference is made to FIG. 16 and operation 1600 in FIG. 12. A planarization process 10 is performed to the semiconductor substrate 206. Portions of the second BARC layer 906, photoresists 904, first BARC layer 902, and the second interlayer dielectric layer 614 are removed. In some embodiments, the second BARC layer 906, photoresists 904, and first BARC layer 902 are removed by an etching process, for example, a dry etching process using plasma similar to previously described. The first/second BARC layer 902/906 and the second interlayer dielectric layer 614 show an etching selectivity of approximately 1 or slightly smaller than 1. That is, a ratio of an etching rate between the first/second BARC layer 902/906 and the second interlayer dielectric layer 614 ranges from 1:1 to 0.9:1. The first/second BARC layer 902/906 and the second interlayer dielectric layer 614 have substantially the same etching resistance to the dry etching.

Figure 17:
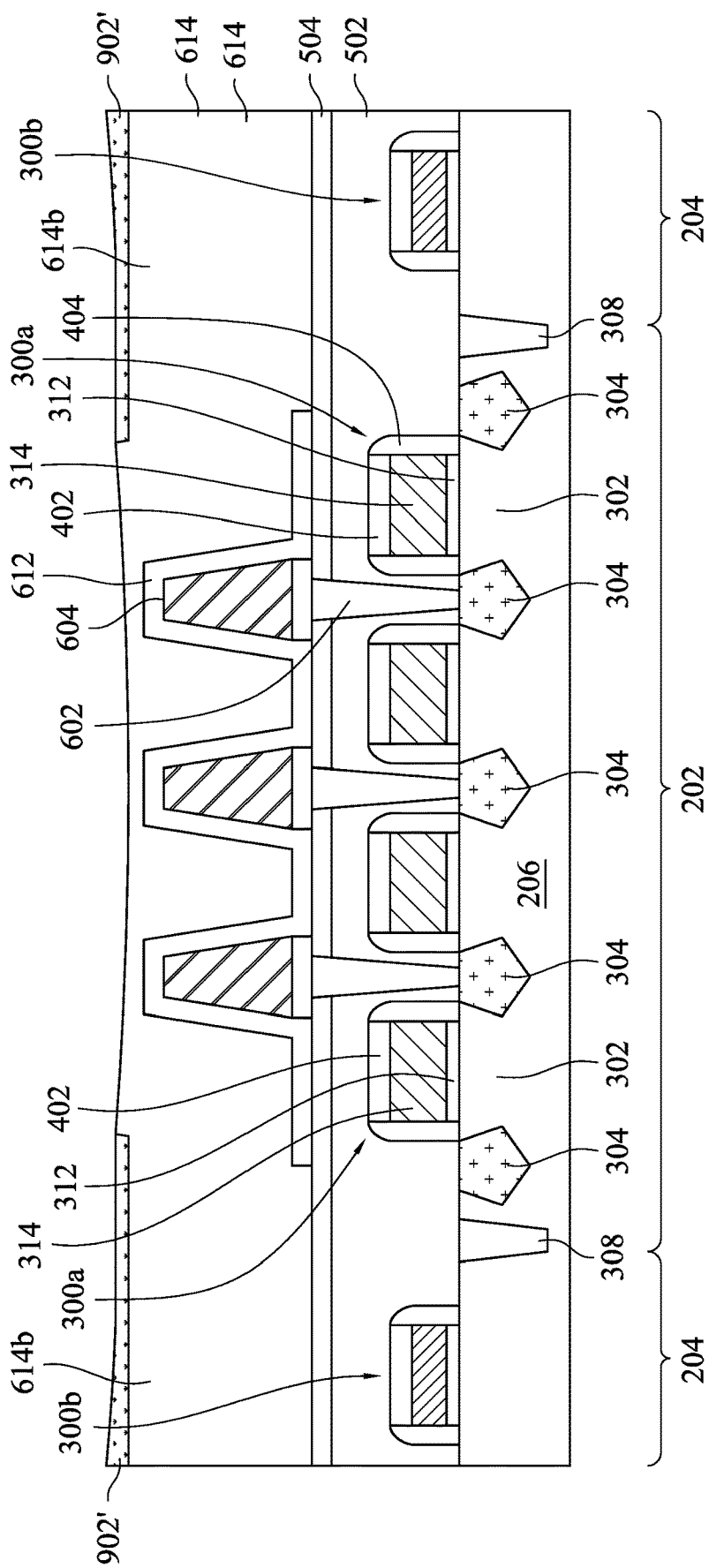

Reference is made to FIG. 17. After the planarization process 10 the peak 614a of the second interlayer dielectric layer 614 is greatly attenuated. The height of the peak 614a is reduced to a similar level as the plateau 614b. Still, residues of the first BARC layer 902' remain on the semiconductor substrate 206. In some embodiments, residues of the photoresists 904 may remain on the semiconductor substrate 206. Because the first/second BARC layer 902/906 and the second interlayer dielectric layer 614 have similar etching rate, the planarization process 10 brings the semiconductor substrate 206 with a relatively planar top surface. The step height between the first region 202 and the second region 204 is negotiated to a neglectable degree. Even though the first region 202 includes capacitor structures 604 that is absent in the second region 204, the second interlayer dielectric layer 614' does not show dramatic peaks and grooves or sub-trenches after planarization.

The remaining first BARC layer 902' is removed from the surface of the second interlayer dielectric layer 614'. The residues of the first BARC layer 902' may be removed by for example, ashing in an oxygen ($O_2$) plasma. The addition of the first and second BARC layer 902 and 906 and photoresists 904 on the semiconductor substrate 206 before planarization ensures a uniform thickness of the second interlayer dielectric layer 614' across the first region 202 and the second region 204. The remaining second dielectric layer 614' has an even surface as shown in FIG. 9.

When a mesa-like device requires planarization, uniform surface level is the key. The photoresist and the bottom anti-reflective coating layer are formed on regions of the semiconductor substrate before planarization. The bottom anti-reflective coating layer has a smaller viscosity than its underlying interlayer dielectric layer. Therefore the bottom anti-reflective coating layer is capable of filling any recesses and furthermore creating a relatively planar surface covering the entire semiconductor substrate. The etching selectivity between the bottom anti-reflective coating layer and the interlayer dielectric layer is approximately 1 or slightly smaller than 1. When planarization is performed, protruded portion of the interlayer dielectric layer is removed, while the remaining portion of the interlayer dielectric layer is protected by the photoresist and bottom anti-reflective coating layer to ensure a uniform thickness of the interlayer dielectric layer.

A method of planarizing a semiconductor device includes forming a first region and a second region on a semiconductor substrate. The first region has a larger thickness than a thickness of the second region. An interlayer dielectric layer is conformally deposited on the first region and the second region. A photoresist is formed on the second region. A bottom anti-reflective coating layer is formed on the photoresist, first region and second region. A planarization process is performed to the semiconductor substrate.

A method of planarizing a semiconductor device includes forming a first region and a second region on a semiconductor substrate. The first region has a larger thickness than a thickness of the second region. An interlayer dielectric layer is conformally deposited on the first region and the second region. A first bottom anti-reflective coating layer is formed on the first region and the second region. A photoresist is formed on the first bottom anti-reflective coating layer and over the second region. A second bottom anti-reflective coating layer is formed on the first bottom anti-reflective layer and the photoresist. A planarization process is performed to the semiconductor substrate.

A semiconductor device includes a semiconductor substrate having a first region and a second region. The first region has a thickness larger than a thickness of the second region. An interlayer dielectric layer is disposed on the semiconductor substrate. The interlayer dielectric layer is substantially planar across the first region and the second region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method of planarizing a semiconductor device, the method comprising:
forming a first region and a second region on a semiconductor substrate, the first region having a larger thickness than a thickness of the second region;

conformally depositing an interlayer dielectric layer on the first region and the second region;
forming a photoresist on the second region;
forming a bottom anti-reflective (BARC) layer on the photoresist, first region and second region;
performing a planarization process on the BARC layer, the photoresist, and the interlayer dielectric layer, such that a first portion of the BARC layer and a first portion of the photoresist remain on the interlayer dielectric layer; and
ashing the first portion of the BARC layer and the first portion of the photoresist.

2. The method of claim 1, wherein the performing the planarization process includes removing a portion of the interlayer dielectric layer, a second portion of the photoresist, and a second portion of the BARC layer.

3. The method of claim 2, wherein the removing the portion of the interlayer dielectric layer, the second portion of the photoresist, and the second portion of the BARC layer is performed by a dry etching.

4. The method of claim 3, wherein the BARC layer and the interlayer dielectric layer have substantially the same etching resistance to the dry etching.

5. The method of claim 1, wherein the photoresist is spaced apart from the first region, and a recess is created between the photoresist and the interlayer dielectric layer before the forming the BARC layer.

6. The method of claim 5, wherein the BARC layer fills in the recess between the photoresist and the interlayer dielectric layer.

7. The method of claim 1, wherein the BARC layer has a smaller viscosity than a viscosity of the interlayer dielectric layer.

8. The method of claim 1, wherein the ashing the first portion of the BARC layer and the first portion of the photoresist is performed such that the first portion of the photoresist and the first portion of the BARC layer are removed.

9. The method of claim 1, wherein the first region is of a memory cell region and the second region is of a logic circuit region.

10. A method of planarizing a semiconductor device, the method comprising:
forming a first region and a second region on a semiconductor substrate, the first region having a larger thickness than that of the second region;
conformally depositing an interlayer dielectric layer on the first region and the second region;
conformally forming a first BARC layer on the first region and the second region;
forming a photoresist on the first BARC layer and over the second region such that the first BARC layer is interposed in between the photoresist and the interlayer dielectric layer;
forming a second BARC layer on the first BARC layer and the photoresist; and
performing a planarization process to the semiconductor substrate.

11. The method of claim 10, wherein the first BARC layer and the second BARC layer have the same material.

12. The method of claim 10, wherein the performing the planarization process to the semiconductor substrate includes removing portions of the interlayer dielectric layer, the first BARC layer, the photoresist, and the second BARC layer.

13. The method of claim 10, wherein the photoresist is spaced apart from the first region.

14. The method of claim 10, wherein removing portions of the interlayer dielectric layer, the first BARC layer, the photoresist, and the second BARC layer is performed by a dry etching.

15. The method of claim 14, wherein the first BARC layer, the second BARC layer and the interlayer dielectric layer have substantially the same etching resistance to the dry etching.

16. The method of claim 10, further comprising:
removing the remaining portions of the first BARC layer, photoresist and second BARC layer.

17. The method of claim 16, further comprising:
forming a redistribution metal layer on the remaining interlayer dielectric layer.

18. A method of planarizing a semiconductor device, the method comprising:
forming a plurality of memory cells above a first interlayer dielectric (ILD) layer;
forming a second ILD layer over the memory cells, wherein the second ILD layer has a first portion overlapping with the memory cells and a second portion non-overlapping with the memory cells;
forming a photoresist overlapping with the second portion and exposing the first portion;
forming a first bottom anti-reflective (BARC) layer over the exposed first portion prior to the forming the photoresist;
forming a second BARC layer over the photoresist and the first BARC layer; and
performing a planarization process to the first BARC layer, the photoresist, and the second ILD layer.

19. The method of claim 18, wherein a height of the first portion of the second ILD layer is greater than a height of the second portion of the second ILD layer.

20. The method of claim 18, wherein forming the photoresist is performed such that the first BARC layer is interposed in between the photoresist and the second ILD layer.

* * * * *